United States Patent
Wieduwilt et al.

(10) Patent No.: US 10,825,544 B2
(45) Date of Patent: *Nov. 3, 2020

(54) CONFIGURABLE POST-PACKAGE REPAIR

(71) Applicant: Micron Technology, Inc., Boise, ID (US)

(72) Inventors: Christopher Gordon Wieduwilt, Boise, ID (US); Kevin Gustav Werhane, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/239,117

(22) Filed: Jan. 3, 2019

(65) Prior Publication Data
US 2020/0219581 A1 Jul. 9, 2020

(51) Int. Cl.
*G11C 29/44* (2006.01)
*G11C 8/12* (2006.01)
*G11C 8/06* (2006.01)

(52) U.S. Cl.
CPC .............. *G11C 29/44* (2013.01); *G11C 8/06* (2013.01); *G11C 8/12* (2013.01)

(58) Field of Classification Search
CPC .............. G11C 29/44; G11C 8/06; G11C 8/12
USPC .................. 365/230.02, 230.08, 201, 189.07
See application file for complete search history.

(56) References Cited

U.S. PATENT DOCUMENTS

| | | | |
|---|---|---|---|
| 10,403,390 B1* | 9/2019 | Wilson | G11C 17/18 |
| 2005/0041491 A1* | 2/2005 | Kyung | G11C 29/4401 365/200 |
| 2014/0078842 A1* | 3/2014 | Oh | G11C 29/785 365/200 |
| 2015/0135038 A1* | 5/2015 | Wilson | G11C 29/76 714/773 |
| 2015/0287480 A1* | 10/2015 | Wilson | G11C 29/70 365/96 |
| 2019/0333601 A1* | 10/2019 | Wilson | G11C 29/70 |

OTHER PUBLICATIONS

U.S. Appl. No. 15/948,585, filed Apr. 9, 2018, Alan J. Wilson.

* cited by examiner

*Primary Examiner* — Connie C Yoha
(74) *Attorney, Agent, or Firm* — Fletcher Yoder, P.C.

(57) ABSTRACT

A memory device includes a memory bank comprising a plurality of addressable groups of memory cells comprising a primary and a secondary set of addressable groups and control circuitry comprising repair address match circuitry, comprising first inputs to receive row address values corresponding to a first group of the primary set of addressable groups, second inputs to receive fused address values corresponding to a second group of the primary set of addressable groups having been repaired, and a selection element, comprising a first selection input to receive a first signal indicative of whether a first row address value is identical to a first fused address value, a second selection input to receive a second signal indicative of whether a second row address value is identical to a second fused address value, and an output to selectively transmit a result as one of the first or second signal.

20 Claims, 7 Drawing Sheets

CONFIGURABLE POST-PACKAGE REPAIR

BACKGROUND

1. Field of the Present Disclosure

This disclosure relates to memory devices, and more particularly, to methods and systems capable of performing post-package repair of memory devices.

2. Description of Related Art

Memory devices, such as random access memory (RAM) devices, dynamic RAM devices (DRAMs), static RAM devices (SRAMs), or flash memories, are often used in electronic systems to provide memory functionality to facilitate data processing operation and/or facilitate data storage that may facilitate data processing operations. To that end, these memory devices may have multiple memory cells that can each store one or more bits of information. The memory cells may be arranged in addressable groups (e.g., rows or columns) within a memory array of a memory bank. When a memory controller receives a request to access a row or column, such as when performing a read or write operation, the memory controller may activate the access to the row and/or column of memory cells.

Due to manufacturing errors and/or failures, certain memory cells may be defective. Quality control testing may be used to identify rows and/or columns containing such defective memory cells. If the number of defective memory cells is small, a pre-packaging re-assignment of memory cells may be used to prevent discarding of otherwise functional devices. In such systems, additional addressable data cells (e.g., redundant rows and/or columns) may be made available during manufacturing and the address associated with a defective row and/or column may be reassigned to a redundant row and/or column. Such reassignment may be hard-wired. For example, the reassignment information may be stored in a non-volatile storage device (e.g., blowing fuses or antifuses disposed within the memory device). Such operation is not easily reversible due to the non-volatility of the storage device.

In the course of usage of the memory device, other memory rows and/or columns may fail and present defective cells. In order to increase the lifetime of the memory devices in the presence of these defects, post-package repair (PPR) methods may be employed to repair the memory device. Methods and systems to perform PPR may include reassignment of the address associated to a row and/or column. To that end, soft PPR (sPPR) methods may be used to perform this reassignment. sPPR may be used to perform this reassignment without blowing antifuses and sPPR reassignment solutions may be lost without power (e.g., when power is removed). The information associated with the reassignment may conflict with other PPR methods, such as hard PPR (hPPR) methods. In contrast with sPPR methods, hPPR methods include techniques whereby the memory device may internally blow reassignment antifuses to maintain the reassignment solution in the absence of power.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may perform storage using electronic memory cells, such as capacitors, flip-flops, latches and/or inverter loops, among others. Examples of memory devices include random access memories (RAMs) devices, dynamic RAM (DRAMs) devices, static RAM (SRAMs) devices, and/or flash memories. In such systems, the memory cells may be grouped in memory arrays, which may be addressed in groups (e.g., rows and/or columns). In the present application, the descriptions of the embodiments are related to memory arrays containing memory cells organized in rows (e.g., data rows). It should be understood that the methods and systems described herein may be used in memory devices having memory cells organized in columns.

During certain operations, such as reading and writing operations, a controller in the memory device may receive an address for a memory cell. The memory device controller may determine which memory bank contains the requested memory cell and request access from the corresponding memory bank controller. In turn, the memory bank controller may identify and activate the data row containing the requested memory cell, to perform the requested operation. In certain memory devices, the memory bank may include additional data rows, which may be redundant rows or post-package repair (PPR) rows, as detailed below. Following manufacturing, defective rows (e.g., data rows containing defective cells) may be identified during pre-package tests. If a defective row is identified, the defective row may be deactivated and a redundant row may be used in its place. To that end, a non-volatile memory system may store information such as the assigned address of the defective row, and the address of the redundant row to be used in its place. Such repair is described herein as redundant row repair. Redundant row repair may occur while a memory device is still with the manufacturer. Further repair of data rows may take place, for example, as post-package repair by assigning a defective row to a PPR row. The post-package repair (PPR) may be a hard post-package repair (hPPR), or soft post-package repair (sPPR) and may also be performed while the memory device is with the manufacturer. PPR may additionally and/or alternatively be performed while the memory device is in the hands of the user or consumer (while, for example, other types of repair including those discussed above are typically not available to the user or customer). hPPR or sPPR may take place by storing the address of a defective row in a memory and rerouting requests from the defective row to a PPR row.

Existing memory device designs may not match sPPR with hPPR row addresses, which compromises manufacturing yield. For example, sPPR and/or hPPR addresses may be limited by the type of the memory device used, the specifications of the memory device, by customer requirements, etc. For example, the Joint Electron Device Engineering Council (JEDEC) double data rate fourth-generation (DDR4) synchronous dynamic random-access memory (SDRAM) optimized seed row address specification may not match manufacturing testing and repair techniques, which may lead to different addresses being repaired between sPPR and hPPR, when a manufacturing repair technique, for example, does not meet the JEDEC DDR4 sPPR optimized seed row addresses spec. One manner to overcome this deficiency is to utilize a fuse-backed selection (e.g., an address match selection fuse) of which row address match the configuration used for the PPR row elements in every DRAM bank. DRAM bank logics may include row address match circuits that correspond to redundant row repair, sPPR, and hPPR. By utilizing the address match selection fuse, it is possible to optimize dynamically for manufacturing yield.

In-house (manufacturer or supplier) redundant repair and PPR (e.g., hPPR) customer repairs may both be undertaken, however, in some situations, the addresses that are used in these repairs may need to be different. Accordingly, it may be advantageous to provide a way of choosing which type of repair one or multiple address match circuits are being used for. In this manner, a different repair solution may be chosen (e.g., undertaken) depending on the state of a selection fuse, which generally answers whether an address match circuit is available for customer PPR or was it already used for in-house (e.g., redundant) repair. The state of the selection fuse allows for selection of which usage is applied to an address match circuit and selects which addresses to compare to create a correct repair solution (e.g. repeat repair for both states of RA2 or repeat repair for both states of RA15).

Figure 1:
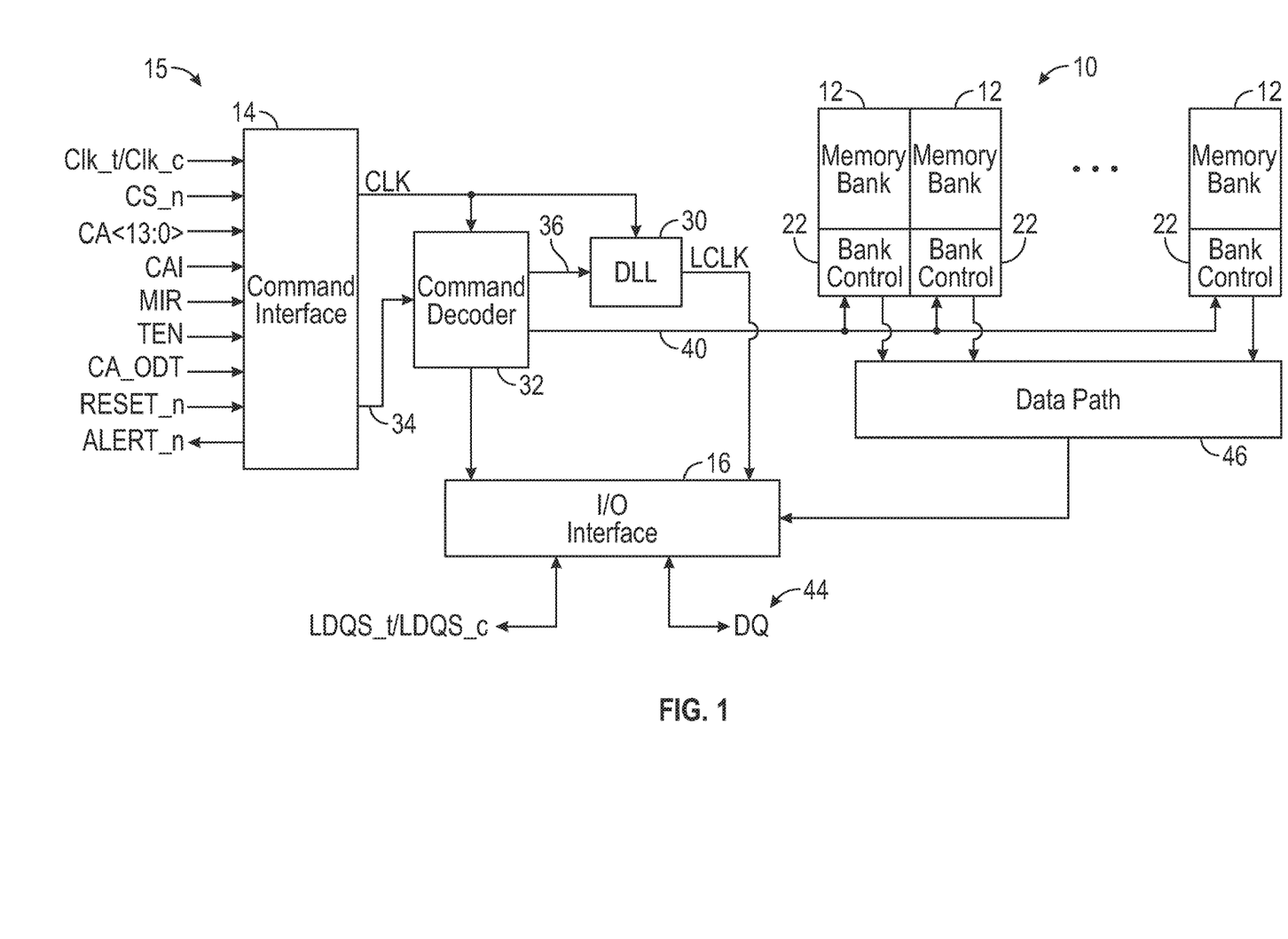
FIG. 1 is a block diagram illustrating an organization of a memory device that may implement post-package repair (PPR) of redundant rows, in accordance with an embodiment.

Turning now to the figures, FIG. 1 is a simplified block diagram illustrating certain features of a memory device 10. Specifically, the block diagram of FIG. 1 is a functional block diagram illustrating a DRAM memory device 10 that may perform PPR in redundant rows. In accordance with one embodiment, the memory device 10 may be a DDR4 SDRAM device, a double data rate type five (DDR5) SDRAM device (which may, for example, allow for reduced power consumption, more bandwidth, and more storage capacity compared to prior generations of DDR SDRAM), low power DDR4 (LPDDR4), LPDDR5, and other memory devices that utilize customer PPR.

The memory device 10 may include a number of memory banks 12. The memory banks 12 may be DDR4 SDRAM memory banks, for instance. The memory banks 12 may be provided on one or more chips (e.g., SDRAM chips) that are arranged on dual inline memory modules (DIMMs). Each DIMM may include a number of SDRAM memory chips (e.g., x8 or x16 memory chips), as will be appreciated. The memory chip (i.e., memory device 10) may be used in non-module type application, for example, as a single die, which may be used, for example, in many mobile applications.

Each SDRAM memory chip may include one or more memory banks 12. The memory device 10 represents a portion of a single memory chip (e.g., SDRAM chip) having a number of memory banks 12. For DDR4, the memory banks 12 may be further arranged to form bank groups. For instance, for an 8 gigabyte (GB) DDR4 SDRAM, the memory chip may include 16 memory banks 12, arranged into 8 bank groups, each bank group including 2 memory banks. For a 16 GB DDR4 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16. The command interface 14 is configured to receive a number of signals (e.g., signals 15) from processing circuitry coupled to the devices, such as a processor or controller. The processor or controller may provide various signals 15 to the memory device 10 to facilitate the transmission and receipt of data to be written to or read from the memory device 10. As an example of signals 15, the processor or controller may request a read and/or write operation by providing the corresponding command and an address via the CA bus.

The command interface 14 may receive one or more clock signals from an external device. Generally, double data rate (DDR) memory utilizes a clock signal referred to herein as a Clk signal 52, which may be provided as a differential pair formed by the true clock signal (Clk_t) and the complementary clock signal (Clk_c). The positive clock edge for Clk signal 52 in DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK may be supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands.

Further, the command decoder 32 may decode commands, such as read commands, write commands, mode-register set commands, activate commands, etc., and provide access to a particular memory bank 12 corresponding to the command, via the bus 40. As will be appreciated, the memory device 10 may include various other decoders, such as row decoders and column decoders, to facilitate access to the memory banks 12. In one embodiment, each memory bank 12 includes a bank control circuitry 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address (CA) bus may be a 14-bit bus to accommodate the command/address signals (CA<13:0>). The command/address signals are clocked to the command interface 14 using the clock (Clk_t and Clk_c), as discussed above. Access to specific memory banks 12 within the memory device 10 is encoded on the CA<13:0> bus with the commands. As an example, a processor requesting data from memory device 10 may provide a CS enable signal via an input pin to inform the memory device 10 that it should operate on the CA signal available in the bus. To this end, the command interface 14 and/or the command decoder 32 may receive the CA signal to identify the command and the target memory banks 12 associated with the address in the CA signal. The command decoder 32 may, via the bus 40, request the bank control circuitry 22 associated with the target memory bank 12 to activate a data row or data column associated with the requested address in the CA signal. Based on the command received via bus 40, the bank control block may cause the memory banks 12 to provide the requested data via data path 46 and I/O interface 16 or to store in the memory banks 12 data available in the data path 46, received via I/O interface 16.

In addition, the command interface 14 may be configured to receive a number of other command signals. For instance, a command/address on die termination (CA_ODT) signal may be provided to facilitate proper impedance matching within the memory device 10. A reset command (RESET) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT) to the system processor or controller for certain errors that may be detected. For instance, an alert signal (ALERT) may be transmitted from the memory device 10 if a cyclic redundancy check (CRC) error is detected. Other alert signals may also be generated. Further, the bus and pin for transmitting the alert signal (ALERT) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. To allow for higher data rates within the memory device 10, certain memory devices, such as DDR memory devices, may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t/ and DQS_c) to provide differential pair signaling during reads and writes.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
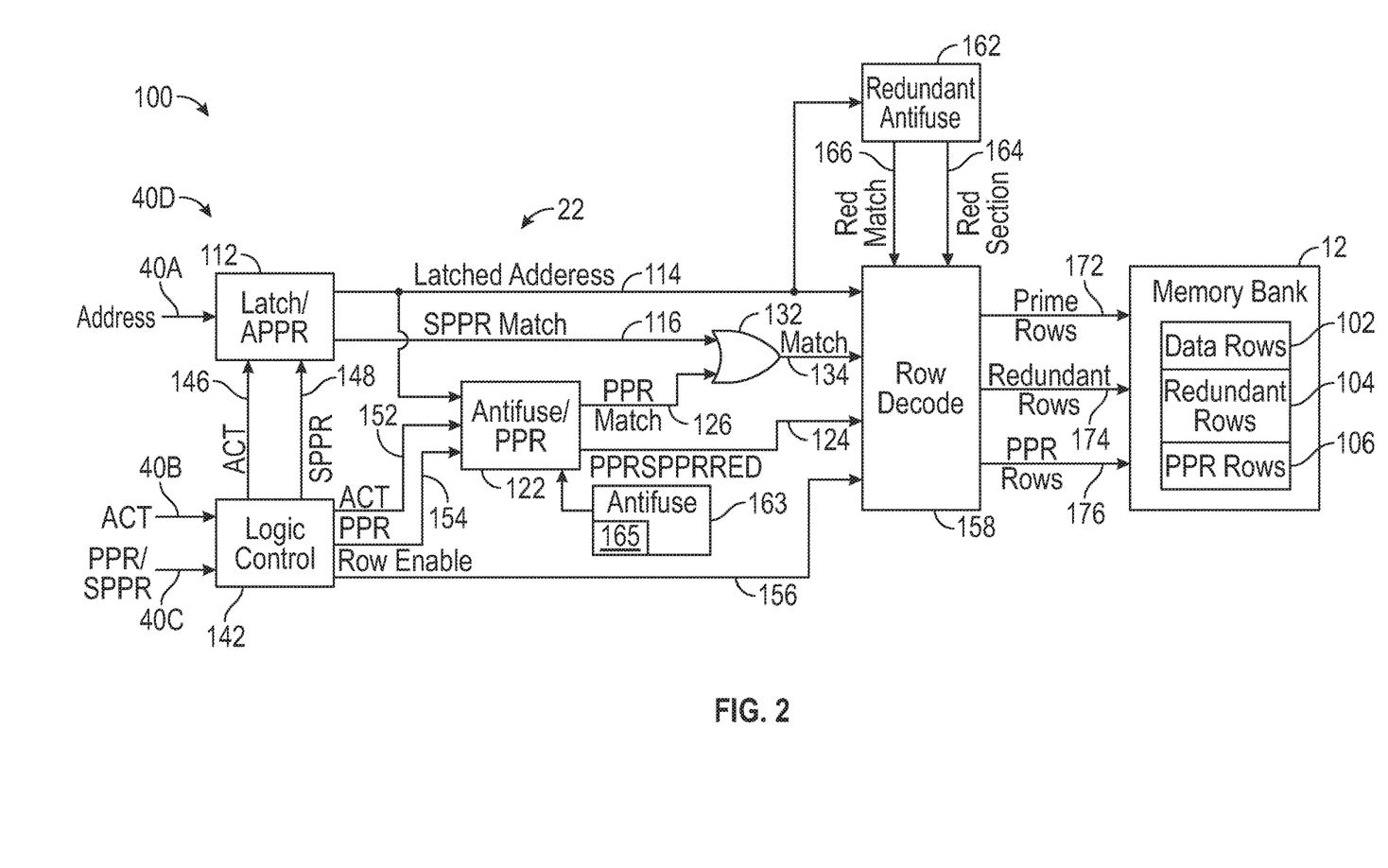
FIG. 2 is a block diagram illustrating memory bank control circuitry that may perform post-package repair (PPR) of redundant rows, in accordance with an embodiment.

FIG. 2 illustrates row selection circuitry 100 that may be disposed in the bank control circuitry 22 that controls a memory bank 12. The memory bank 12 may include an array of memory cells, which may be arranged in rows and/or columns. In the illustrated example, memory cells in memory bank 12 are arranged in data rows 102 (e.g., primary data cells), redundant rows 104, and PPR rows 106 (e.g., secondary data cells used for repair), together which may be referred to as addressable groups of memory cells. In this memory bank 12, data rows 102 include the memory cell rows initially assigned for regular operation during production and redundant rows 104 include additional memory cell rows that may be used during pre-package repair and/or in post-package repair by the manufacturer (i.e., prior to receipt and use by the customer/user), as discussed above (e.g., repair(s) performed by a non-customer or non-end-user). The PPR rows 106 may be additional memory cell rows available for usage in soft post-package repair or hard post-package repair (e.g., repair performed by a customer). As detailed below, data rows 102 may be directly addressed by prime row activation lines, redundant rows 104 may be selected by redundant row selection lines and PPR rows 106 may be activated by PPR selection lines. In some memory devices, redundant rows 104 and PPR rows 106 may be a single group of memory cell rows with a shared address scheme.

Row selection circuitry 100 may receive an address signal 40A, an activation (ACT) signal 40B, and a sPPR/hPPR signal 40C. Based on the address contained in the address signal 40A, row selection circuitry may activate a corresponding prime data row 102, if that row has not been repaired. If the row has been repaired, either via the redundant row mechanism, performed in the hands of the manufacturer or supplier (even if performed after packaging), or via the hPPR or the sPPR performed after packaging (e.g., by the customer), row selection circuitry 100 may prevent activation of the corresponding defective prime data row 102 and may activate the repaired row (e.g., the redundant row 104 or the PPR row 106) reassigned to be used in place of the defective prime data row 102. To perform and/or identify a sPPR repair, the sPPR circuitry 112 may be used. During a sPPR repair operation, sPPR circuitry 112 may store the received address in address signal 40A in a local volatile memory, to perform sPPR. In some embodiments, the sPPR circuitry 112 may instead be disposed away from the memory bank 12 (i.e., in remote volatile memory), for example, based upon specifications of the memory device 10.

During regular operation (i.e., not during a repair), sPPR circuitry 112 receives and latches the address signal 40A to produce a latched address 114, that may be used by other circuitry in the row selection circuitry 100. Moreover, if the sPPR circuitry 112 determines that the address in the address signal 40A matches the stored address, the sPPR circuitry may provide a sPPR match signal 116 to indicate that the received address signal 40A corresponds to a row repaired via sPPR.

To perform and/or identify hPPR repair, hPPR circuitry 122 may be used. During a hPPR repair operation, the hPPR circuitry 122 may store the latched address 114 in a local non-volatile memory, which may be write-once internal memory devices (e.g., antifuse banks). In some embodiments, each non-volatile memory cell may be associated with a PPR row 106. During regular operation (i.e., not during a repair), hPPR circuitry 122 may compare the latched address 114 with the address stored in the antifuse banks and, if a match appears, provide a corresponding PPR row address 124 and a hPPR match signal 126. A logic element 132 (e.g., OR gate) may combine sPPR match signal 116 and hPPR match signal 126 to produce a match signal 134. During regular operation, match signal 134 indicates that the address signal 40A contains an address that was repaired via hPPR and/or sPPR.

Controller logic 142 in the row selection circuitry 100 may be used to manage the operation of sPPR circuitry 112 and hPPR circuitry 122. Controller logic 142 may receive, via sPPR/hPPR signal 40C, instructions to indicate that the customer is requesting a post-package repair (e.g., a hPPR or a sPPR). In some embodiments, the sPPR/hPPR signal 40C may be an instruction that specifies the mode of post-package repair. In some embodiments, the sPPR/hPPR signal 40C may be an instruction requesting a repair to be performed without specifying a specific mode of post-package repair. Controller logic may also receive the ACT signal 40B, that may include an activation trigger (e.g., an activating edge) that synchronizes the operations associated with data row activation and/or data row repair. When controller logic 142 requests a sPPR, controller logic 142 may send an ACT signal 146 and a sPPR signal 148 to the sPPR circuitry 112. When controller logic 142 requests a hPPR, it may send an ACT signal 152 and a hPPR signal 154 to the hPPR circuitry 122.

Controller logic 142 may also provide an activating row enable signal 156 to a row decoder 158 to trigger an activation of memory cell rows. Row decoder 158 may receive the latched address 114, the PPR row address 124, the match signal 134 and the row enable signal 156, described above. Row decode may be further coupled to redundant repair circuitry 162, that may store address repaired pre-packaging. Redundant repair circuitry 162 may compare a received latched address 114 with internal non-volatile memory cells (e.g., antifuse banks). If a match is identified (i.e., latched address 114 is associated with a redundant row 104), redundant repair circuitry 162 may provide the redundant row address 164 associated with the latched address 114, and assert the redundant match signal 166. In some embodiments, redundant repair circuitry 162 and hPPR circuitry 122 functionalities may be provided by a single repair circuitry that includes non-volatile memory storing repaired addresses matched to redundant rows 104 and/or PPR rows 106 and/or by antifuse circuit 163. Additionally, in some embodiments, the antifuses from each of the redundant repair circuitry 162 and hPPR circuitry 122 may be disposed in an antifuse circuit 163, which may be a centralized location (grouping) of the fuses described above. In some embodiments, the antifuse circuit may include one or more extra fuses, such as an address match selection fuse 165, which, are not used, for example, in connection with the redundant repair circuitry 162 and hPPR circuitry 122 functionalities.

Row decoder 158, detailed below, may receive the latched address 114, repair match information (e.g., match signal 134 and redundant match signal 166), repair address (e.g., PPR row address 124 and redundant row address 164), and a triggering row enable signal 156, and activate specific data rows. If the latched address corresponds to a prime data row 102 that has not been repaired, row decoder 158 may activate the prime row (i.e., the prime data row 102 assigned during manufacturing) via prime row signal 172. If the latched address corresponds to a redundant row repair, row decoder 158 may activate the associated redundant row using the redundant row address bus 174. If the latched address corresponds to a post-package repaired row, row decoder 158 may activate the associated PPR row using the PPR row address bus 176. Row selection circuitry 100 implements an overriding or trumping mechanism for operation. For example, JEDEC specifications may require sPPR to trump hPPR, while hPPR trumps the supplier's redundant row repair. Such a mechanism obviates the requirement for overriding redundant row repairs in the process of performing hPPRs and/or sPPRs, as the non-volatile memory in redundant repair circuitry 162 does not need to be modified.

Figure 3:
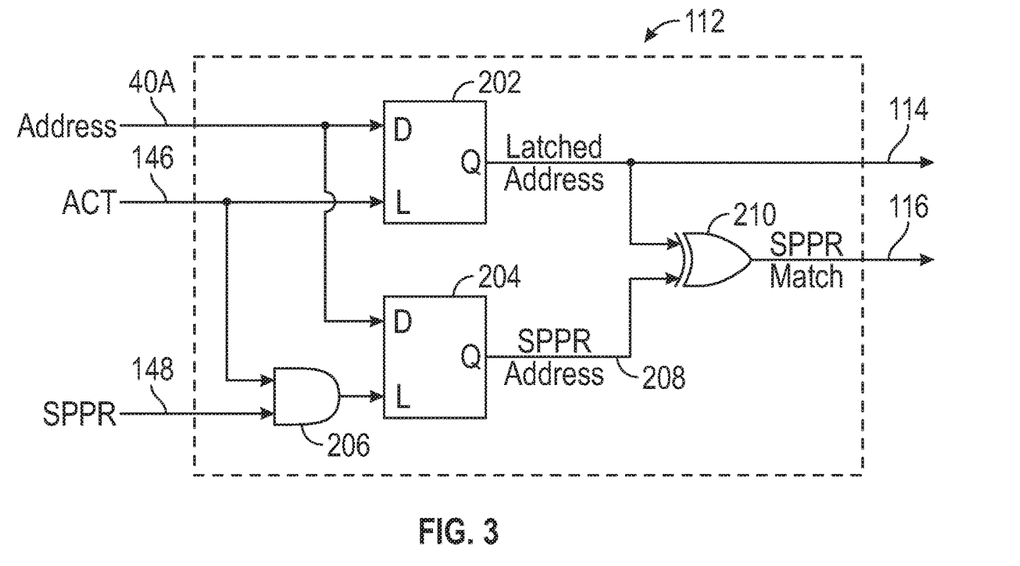
FIG. 3 is a block diagram illustrating a soft PPR (sPPR) latch circuitry that may be used by memory bank control circuitry such that of FIG. 2, in accordance with an embodiment.
Figure 4:
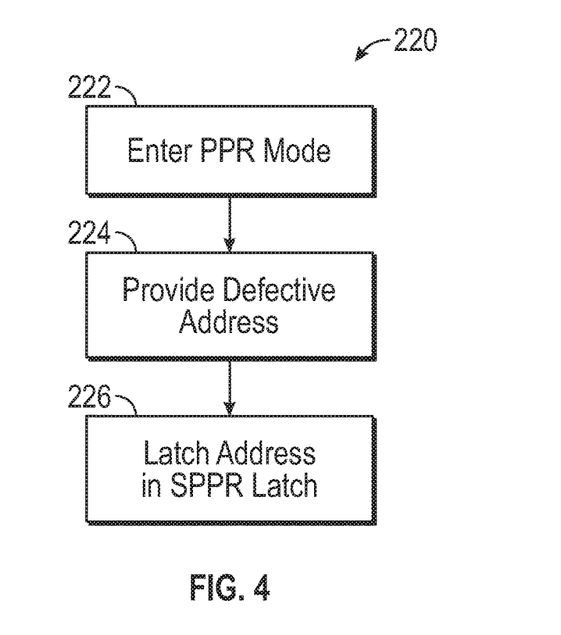
FIG. 4 is a method to perform sPPR, in accordance with an embodiment.

FIG. 3 illustrates sPPR circuitry 112, and FIG. 4 illustrates a method 220 for performing sPPR using the sPPR circuitry 112. As discussed above, sPPR circuitry may receive an address signal 40A and a triggering ACT signal 146. A latch 202 may store the address in the address signal 40A, as triggered using the ACT signal 146, to provide latched address 114. sPPR latch 204 may be used to store an address to perform a sPPR, as triggered by the sPPR signal 148. By asserting the sPPR signal 148, the sPPR circuitry may enter a sPPR mode (e.g., block 222 of method 220). The address to be repaired may be provided via address signal 40A (e.g., block 224 of method 220). The logic element 206 (e.g., an AND gate) may combine the triggering ACT signal 146 and the asserted sPPR signal to make the sPPR latch 204 transparent. In the transparent state, sPPR latch 204 may store the address to be repaired (e.g., block 226 of method 220). Once the sPPR signal 148 is deasserted, sPPR latch 204 may store the repaired address. During regular operation, the sPPR latch 204 is not transparent, and may provide the sPPR address 208. A logic element 210 (e.g., XOR gate) may compare the stored sPPR address with the latched address 114. If the address matches (e.g., all bits of the latched address 114 are the same as the bits of the sPPR address 208), the sPPR match signal 116 may be asserted.

Figure 5:
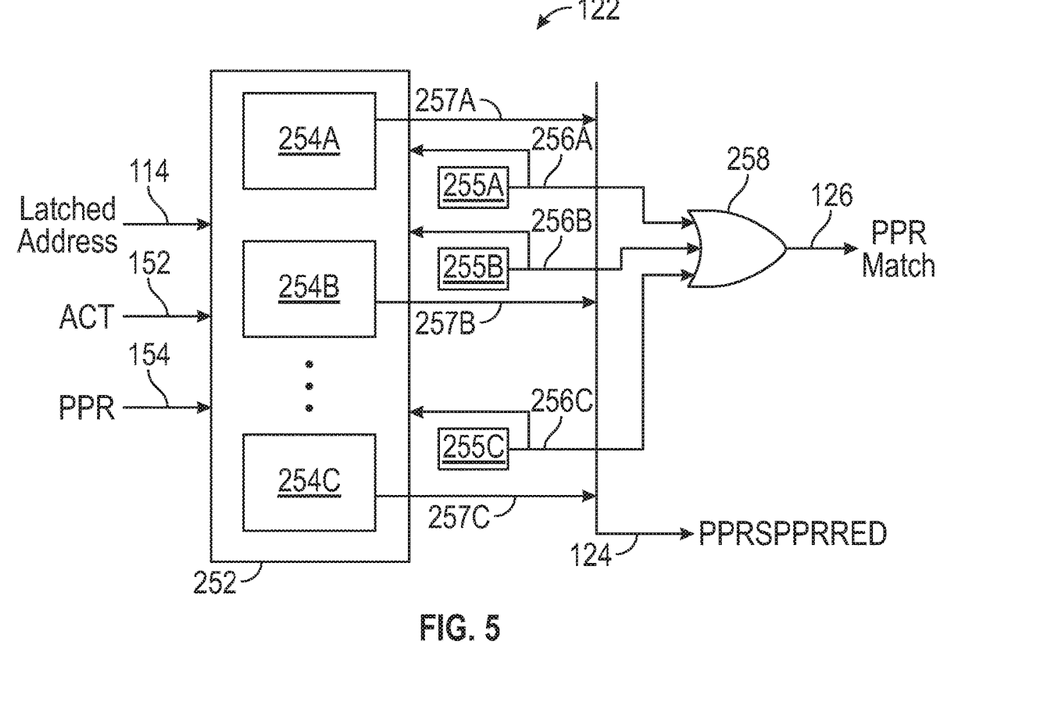
FIG. 5 is a block diagram illustrating hard PPR (hPPR) storage circuitry, that may be used by memory bank control circuitry such as that of FIG. 2, in accordance with an embodiment.
Figure 6:
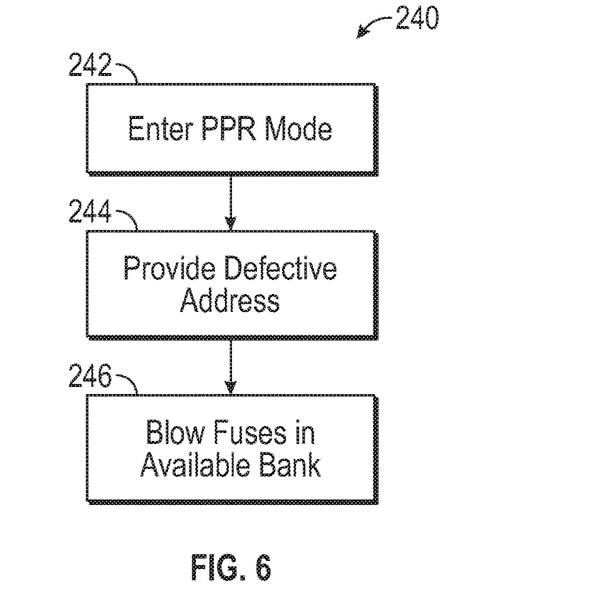
FIG. 6 is a method to perform hPPR, in accordance with an embodiment.

FIG. 5 illustrates hPPR circuitry 122, and FIG. 6 illustrates a method 240 for performing hPPR using the hPPR circuitry 122. In the illustrated hPPR circuitry 122, non-volatile storage or antifuse banks 252 may be present and, for example, the illustrated antifuse banks 254A, 254B, and 254C may be disposed therein. Each antifuse bank 254 may be a write-once memory device. To enter the hPPR operation (e.g., block 242 of method 240), the hPPR circuitry 122 may receive a hPPR signal 154 and a triggering ACT signal 152. The hPPR circuitry 122 may also receive the latched address 114 to be repaired (block 244 of method 240). Upon receiving the ACT signal 152, the hPPR circuitry 122 may blow fuses of the antifuse banks 252 to store the latched address 114 of one or more defective data rows 102 (block 246 of method 240).

Returning to FIG. 5, the hPPR circuitry 122 may additionally include repair address match circuitry 255A, 255B, and 255C. In some embodiments, the repair address match circuitry 255A, 255B, and 255C may correspond to each of the antifuse banks 254A, 254B, and 254C and may operate to generate match signals 256A, 256B, and 256C, respectively, as will be described in greater detail below with respect to FIGS. 7 and 8. Match signals 256A, 256B, and 256C may represent the results of a comparison of the latched address 114 with the address stored in the respective antifuse banks 254A, 254B, and 254C. A logic element 258 (e.g., OR gate) may combine the match signals 256A, 256B, 256C, etc., to form a single hPPR match signal 126, described above.

In some embodiments, each antifuse bank may be associated with a PPR row 106. In such embodiment, if a match occurs, the repair address match circuitry 255A, 255B, or 255C can cause the transmission of an address 257A, 257B, or 257C, respectively from the antifuse banks 252. For example, the repair address match circuitry 255A may transmit the match signal 256A to the antifuse banks 252 (or to the antifuse bank 254A) to cause the antifuse bank 254A to provide an address 257A as the PPR row address 124. Similarly, the repair address match circuitry 255B may transmit the match signal 256B to the antifuse banks 252 (or to the antifuse bank 254B) to cause the antifuse bank 254B to provide an address 257B. Likewise, the repair address match circuitry 255C may transmit the match signal 256C to the antifuse banks 252 (or to the antifuse bank 254C) to cause the antifuse bank 254C to provide an address 257C as the PPR row address 124. It should be noted that the addresses 257A, 257B, and 257C are addresses associated with PPR rows 106 and may be distinct from the latched address 114 or the addresses stored in the antifuse banks 254.

It should be noted that while the repair address match circuitry 255A, 255B, or 255C are illustrated as distinct elements, in some embodiments, a single repair address match circuitry 255 (disposed either internal to the hPPR circuitry 122 or external to and coupled to the hPPR circuitry) may instead be utilized in a manner similar to that described above. For example, the repair address match circuitry 255 may generate a match signal 256 that may represent the results of a comparison of the address 40A (or, for example, latched address 114) with the address stored in one or the respective antifuse banks 254A, 254B, and 254C. Use of a single repair address match circuitry 255 might allow for the removal of the logic element 258 (e.g., OR gate) and the match signal 256 generated by the repair address match circuitry 255 could be transmitted directly as the hPPR match signal 126. The match signal 256 generated by the repair address match circuitry 255 could also be transmitted to the antifuse banks 252 (or to the respective antifuse bank 254A, 254B, or 254C) from which the match was generated to cause that antifuse bank 254A, 254B, or 254C to provide an address 257A, 257B, or 257C.

Figure 7:
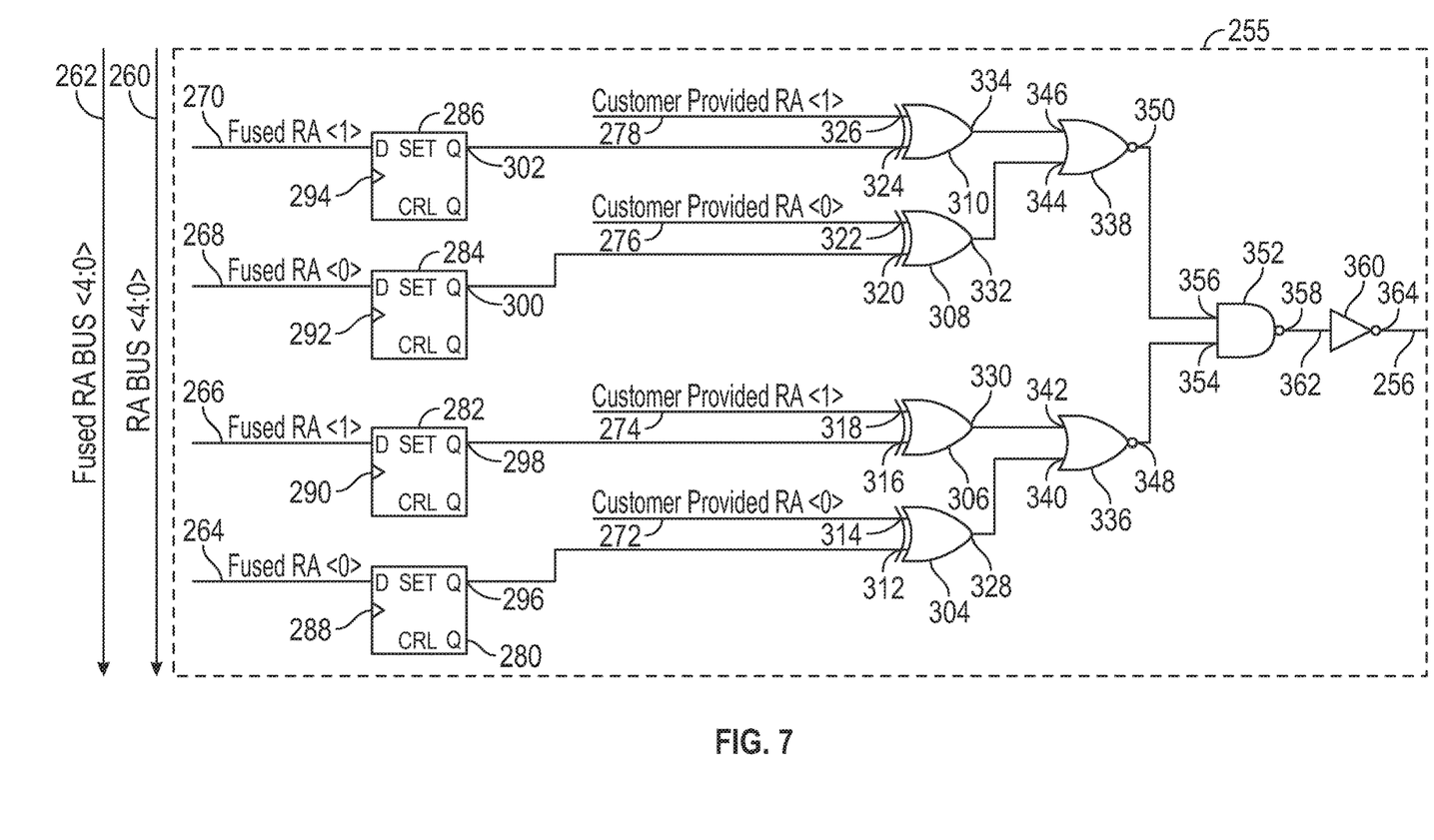
FIG. 7 is a block diagram of a first embodiment of repair address match circuitry that and may be used by memory bank control circuitry such that of FIG. 2, in accordance with an embodiment.

FIG. 7 illustrates an example of the repair address match circuitry 255. It should be noted that in some embodiments, the repair address match circuitry 255A, 255B, and 255C described above may be similar to the repair address match circuitry 255 illustrated in FIG. 7. Additionally, the sections below describe examples of elements and logic to describe operation of the repair address match circuitry. However, it is understood that the elements of FIG. 7 are provided as examples only, and that it is understood that the match logic described below may be implemented in other manners and/or utilizing different logic elements.

In some embodiments, the repair address match circuitry 255 may receive one or more row addresses (e.g., address 40A or latched address 114) from, for example, row address (RA) bus 260, which may be coupled to the repair address match circuitry 255. It should be appreciated that the addresses transmitted and/or the size of the RA bus 260 may be determined by the architecture and/or the type of the memory device 10 or the row selection circuitry 100. For purposes of discussion, in the illustrated embodiment, the RA bus 260 includes lines that transmit row address values RA<0>, RA<1>, RA<2>, RA<3>, and RA<4>. During operation, a user may provide row addresses and these row addresses are transmitted to a memory bank 12, for example, on every customer activate, in conjunction with a column command for column repair, or in other situations, for example, situations that may be governed by the specifications of the memory device 10. The row addresses may be compared to known defective rows prior to activation or access. As illustrated, the RA bus 260 includes lines that transmit at least a portion of these row addresses, specifically row address values RA<0>, RA<1>, RA<2>, RA<3>, and RA<4> as bit values.

Additionally, the repair address match circuitry 255 may receive one or more fused row addresses from, for example, fused RA bus 262, which may be additionally coupled to the repair address match circuitry 255. The fused RA bus 262 may operate to transmit a set of fused addresses, which may be derived from blown fuses that are broadcast or otherwise transmitted from centrally located fuses (e.g., antifuse circuit 163) and which may be latched locally on a power-up, reset, or other initiation of the row selection circuitry 100 and/or the memory device 10. It should be appreciated that the fused addresses transmitted and/or the size of the fused RA bus 262 may be determined by the architecture and/or the type of the memory device 10 or the row selection circuitry 100. For purposes of discussion, in the illustrated embodiment, the fused RA bus 262 includes lines that transmit fused address values Fused RA<0>, Fused RA<1>, Fused RA<2>, Fused RA<3>, and Fused RA<4>.

The bits transmitted along the fused RA bus 262 correspond to a defective row or set of rows of the data rows 102. The fuses that correspond to the bits transmitted along the fused RA bus 262 may have been blown at a prior time, for example, during the in-house test flow or perhaps via a hPPR operation. In some embodiments, not all of the addresses transmitted along the fused RA bus 262 are indicative of a particular repair (i.e., some addresses are potentially DON'T CARE, where a repair for both states of the DON'T CARE bit), and this situation will be discussed below.

As illustrated, the repair address match circuitry 255 includes inputs 264, 266, 268, and 270. The inputs 264, 266, 268, and 270 are coupled to the fused RA bus 262 and each input 264, 266, 268, and 270 receives a respective fused address value, Fused RA<0> at input 264, Fused RA<1> at input 266, Fused RA<2> at input 268, and Fused RA<3> at input 270. Similarly, the repair address match circuitry 255 includes inputs 272, 274, 276, and 278. The inputs 272, 274, 276, and 278 are coupled to the RA bus 26 and each input 272, 274, 276, and 278 receives a respective row address value, RA<0> at input 272, RA<1> at input 274, RA<2> at input 276, and RA<3> at input 278. The repair address match circuitry 255 also includes latches (e.g., D-latches) 280, 282, 284, and 286 that operate to respectively receive the respective fused address values, Fused RA<0>, Fused RA<1>, Fused RA<2>, and Fused RA<3>. The latches 280, 282, 284, and 286 may output the fused address values, Fused RA<0>, Fused RA<1>, Fused RA<2>, and Fused RA<3> upon receipt of a control signal, such as a clock signal or another signal, at inputs 288, 290, 292, and 294 of the latches 280, 282, 284, and 286. Upon receipt of a control signal at input 288, latch 280 may transmit fused address value Fused RA<0> from an output 296 of the latch 280. Similarly, upon receipt of control signals at inputs 290, 292, and 294, latches 282, 284, and 286 may transmit fused address values Fused RA<1>, Fused RA<2>, and Fused RA<3> from outputs 298, 300, and 302 of the latches 282, 284, and 286, respectively. In some embodiments, the control signals received at inputs 288, 290, 292, and 294 may be synchronized or may be the same control signal so as to synchronize operation of the latches 280, 282, 284, and 286.

The repair address match circuitry 255 may further include exclusive-OR (XOR) gates 304, 306, 308, and 310 that each include respective inputs 312, 314, 316, 318, 320, 322, 324, and 326. Input 312 of XOR gate 304 may be coupled to output 296 to receive fused address value Fused RA<0>. Input 314 of XOR gate 304 may be coupled to input 272 to receive row address value RA<0>. Input 316 of XOR gate 306 may be coupled to output 298 to receive fused address value Fused RA<1>. Input 318 of XOR gate 306 may be coupled to input 274 to receive row address value RA<1>. Input 320 of XOR gate 308 may be coupled to output 300 to receive fused address value Fused RA<2>. Input 322 of XOR gate 308 may be coupled to input 276 to receive row address value RA<2>. Input 324 of XOR gate 310 may be coupled to output 302 to receive fused address value Fused RA<3>. Input 326 of XOR gate 310 may be coupled to input 278 to receive row address value RA<3>. Each of the XOR gates 304, 306, 308, and 310 may generate a result (i.e., a binary signal) based on the binary values of the respective fused address and row address value received by the XOR gate 304, 306, 308, and 310. This result (which may be termed an XOR result or a first level result) may be a binary low value ("0") when the binary value of the bits for both of the respective fused address and row address value received by the XOR gate 304, 306, 308, and 310 have a binary low value ("0") or when the binary value of the bits for both of the respective fused address and row address value received by the XOR gate 304, 306, 308, and 310 have a binary high value ("1"). In all other instances, (i.e., when one of the fused address and the address has a first binary value, i.e., a binary high value "1" and the other of the fused address and the address has a second opposite binary value, i.e., a binary low value "0") the result of the XOR gate 304, 306, 308, and 310 will be a binary high value ("1"). The result generated by the XOR gate 304 will be transmitted from output 328 of the XOR gate 304. Likewise, the results generated by the XOR gates 306, 308, and 310 will be transmitted from output 330 of XOR gate 306, output 332 of XOR gate 308, and output 334 of XOR gate 310.

The results generated by the XOR gates 304, 306, 308, and 310 are transmitted to a not-OR (NOR) gates 336 and 338 that represent a negation (i.e., inversion) of a digital OR operation. NOR gates 336 and 338 each include respective inputs 340, 342, 344, and 346. Input 340 of NOR gate 336 may be coupled to output 328 to receive the result from XOR gate 304. Input 342 of NOR gate 336 may be coupled to output 330 to receive the result from XOR gate 306. Likewise, input 344 of NOR gate 338 may be coupled to output 332 to receive the result from XOR gate 308 and input 346 of NOR gate 338 may be coupled to output 334 to receive the result from XOR gate 310. Each of the NOR gates 336 and 338 may generate a second result (i.e., a binary signal) based on the binary values of the results generated by the XOR gates 304, 306, 308, and 310. The second result (which may be termed a NOR result or a second level result) may be a binary high value ("1") when the binary value of the bits for both of the results from XOR gates 304 and 306 (or XOR gates 308 and 310) have a binary low value ("0"). In all other instances, (i.e., when the bit value of both of the results from XOR gates 304 and 306 (or XOR gates 308 and 310) have a binary high value "1", or when one of the results from XOR gates 304 and 306 (or XOR gates 308 and 310) has a first binary value, i.e., a binary high value "1" and the other of the results from XOR gates 304 and 306 (or XOR gates 308 and 310) has a second opposite binary value, i.e., a binary low value "0") the second result generated by the NOR gate 336 and 338 will be a binary low value ("0"). The second result generated by the NOR gate 336 will be transmitted from output 348 of the NOR gate 336. Likewise, the second result generated by the NOR gates 338 will be transmitted from output 350 of the NOR gate 338.

The second results generated by the NOR gates 336 and 338 are transmitted to a not-AND (NAND) gate 352 that represents a negation (i.e., an inversion) of a digital AND operation. NAND gate 352 includes inputs 354 and 356. Input 354 of NAND gate 352 may be coupled to output 348 to receive the result from NOR gate 336 and input 356 of NAND gate 352 may be coupled to output 350 to receive the result from NOR gate 338. NAND gate 352 may generate a third result (i.e., a binary signal) based on the binary values of the results generated by the NOR gates 336 and 338. The third result (which may be termed a NAND result or a third level result) may be a binary low value ("0") when the binary value of the bits for both of the results from NOR gates 336 and 338 have a binary high value ("1"). In all other instances, (i.e., when the bit value of both of the results from NOR gates 336 and 338 have a binary low value "0" or when one of the results from NOR gates 336 and 338 has a first binary value, i.e., a binary high value "1" and the other of the results from NOR gates 336 and 338 has a second opposite binary value, i.e., a binary low value "0") the third result generated by the NAND gate 352 will be a binary high value ("1"). The third result generated by the NAND gate 352 will be transmitted from output 358 of the NAND gate 352.

The third result generated by the NAND gate 352 is transmitted to an inverter 360 that operates to invert the third result. The inverter 360 include input 362 that may be coupled to output 358 to receive the third result from NAND gate 352 and the inverter 360 may transmit an inverted binary value of the third result from an output 364 of the inverter 360 as match signal 256. In some embodiments, this match signal 256 indicates that the (user provided or customer provided) address signal 40A (or latched address 114) has been repaired. This will re-steer the latched address to a defined functional redundant element, e.g., in PPR rows 106). It may be appreciated that the circuitry utilized in the repair address match circuitry 255 is provided as an example and that other circuitry may be utilized in place of the illustrated circuitry to arrive at generation of the match signal 256.

As illustrated in FIG. 7, the RA bus 260 includes lines that transmit row address values RA<0>, RA<1>, RA<2>, RA<3>, and RA<4>. However, only row address values RA<0>, RA<1>, RA<2>, RA<3> are compared against fused address values, e.g., Fused RA<0>, Fused RA<1>, Fused RA<2>, Fused RA<3>. By not comparing row address value RA<4>, both states of RA<4> match as being repaired (i.e., row address value RA<4> is a DON'T CARE bit value where its binary value does not impact the repair). This may cause potential issues since, for example, having the row address value RA<4> as a DON'T CARE bit value does not allow for duplicate repair for both states in sPPR (e.g., a seed row may refer to the full row address supplied by a customer during an active cycle for the defective row). This may not allow a user (i.e., a customer) to properly copy data out for the opposite state (e.g., a hPPR follows a manufacturing or supplier repair match, however, the sPPR is unique such that a customer introduces live rows that are not tested with sPPR when blowing in a hPPR repair).

Alternatively, in one embodiment, the row address value RA<4> may instead be a CARE address (where its binary value impacts the repair) and utilized in a separate sPPR match circuit. The separate sPPR match circuit may differ from the repair address match circuitry 255 of FIG. 7 in that the separate sPPR match circuit may be set up to receive the fused address value Fused RA<4> at input 270 and receive the row address value RA<4> at input 278 instead of receiving the fused address value Fused RA<3> at input 270 the row address value RA<3> at input 278, as illustrated in the repair address match circuitry 255. This allows for comparison of the row address value RA<4> with the fused address value Fused RA<4> (in place of the row address value RA<3> with the fused address value Fused RA<3> in a sPPR match circuit). This makes the row address value RA<3> a DONT CARE bit in the sPPR match circuit. Use of the separate sPPR match circuit described above allows for matching of hPPR and sPPR repair (e.g., a hPR follows a sPPR match such that a customer introduces live rows that can be tested with sPPR when blowing in a hPPR repair, however, the manufacturing or supplier repair is unique, which may result in portions of the PPR rows 106 being unavailable to be used for repair if needed and any yield on memory devices 10 may be reduced).

Figure 8:
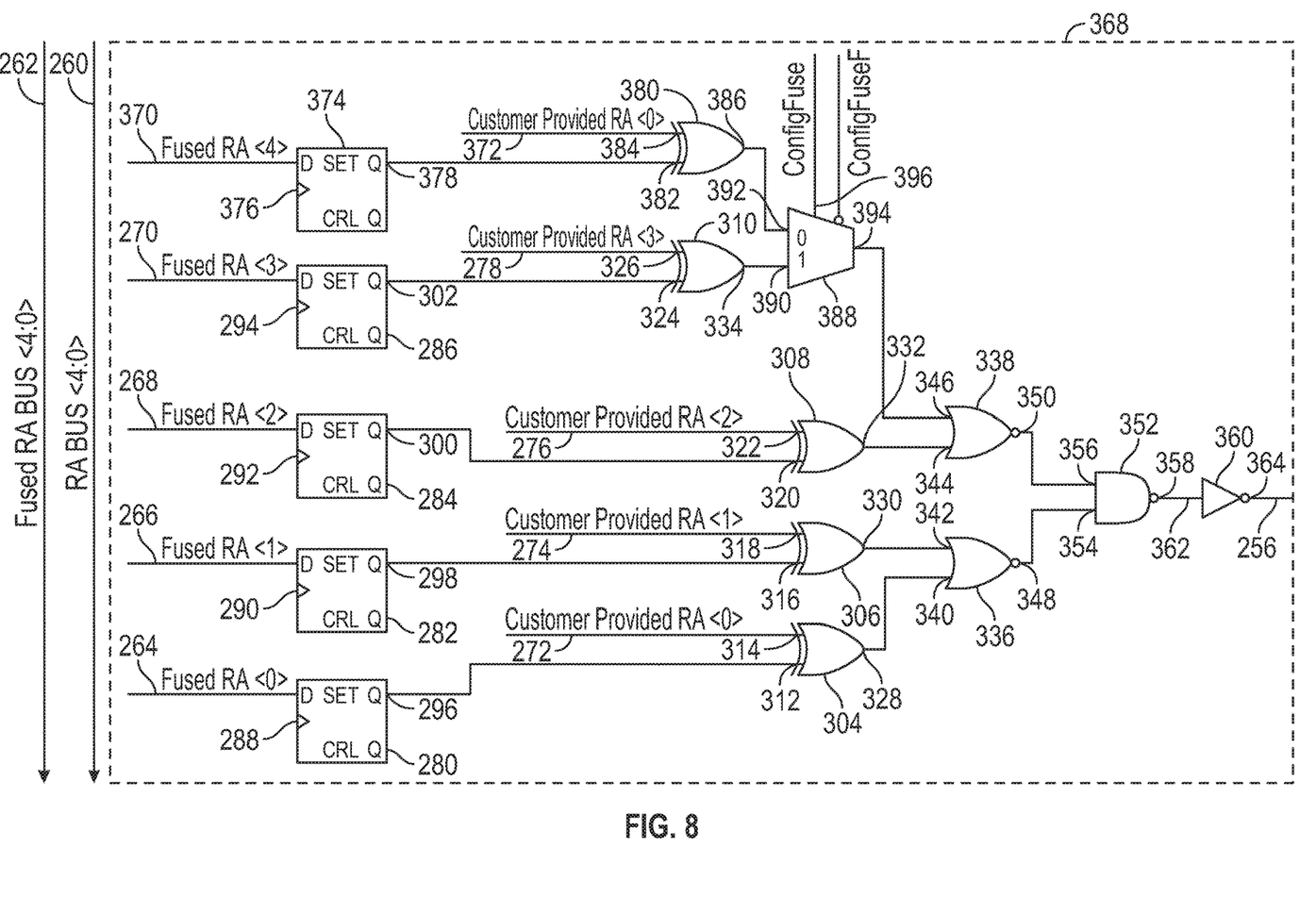
FIG. 8 is a block diagram of a second embodiment of repair address match circuitry that and may be used by memory bank control circuitry such that of FIG. 2, in accordance with an embodiment.

FIG. 8 illustrates repair address match circuitry 368 that may be utilized in place of the repair address match circuitry 255 of FIG. 7 (as well as in place of the separate sPPR match circuit described above). The sections below describe examples of elements and logic to describe operation of the repair address match circuitry. However, it is understood that the elements of FIG. 8 are provided as examples only, and that it is understood that the match logic described below may be implemented in other manners and/or utilizing different logic elements.

As illustrated, the repair address match circuitry 368 includes inputs 264, 266, 268, 270, and 370. The inputs 264, 266, 268, 270, and 370 are coupled to the fused RA bus 262 and each input 264, 266, 268, 270, and 370 receives a respective fused address value, Fused RA<0> at input 264, Fused RA<1> at input 266, Fused RA<2> at input 268, Fused RA<3> at input 270, and Fused RA<4> at input 370. Similarly, the repair address match circuitry 368 includes inputs 272, 274, 276, 278, and 372. The inputs 272, 274, 276, 278, and 372 are coupled to the RA bus 26 and each input 272, 274, 276, 278, and 372 receives a respective row address value, RA<0> at input 272, RA<1> at input 274, RA<2> at input 276, RA<3> at input 278, and RA<4> at input 372. The repair address match circuitry 368 also includes latches (e.g., D-latches) 280, 282, 284, 286, and 374 that operate to respectively receive the respective fused address values, Fused RA<0>, Fused RA<1>, Fused RA<2>, Fused RA<3>, and Fused RA<4>. The latches 280, 282, 284, 286, and 374 may output the fused address values, Fused RA<0>, Fused RA<1>, Fused RA<2>, Fused RA<3>, and Fused RA<4> upon receipt of a control signal, such as a clock signal or another signal, at inputs 288, 290, 292, 294, and 376 of the latches 280, 282, 284, 286, and 374. Upon receipt of a control signal at input 288, latch 280 may transmit fused address value Fused RA<0> from an output 296 of the latch 280. Similarly, upon receipt of control signals at inputs 290, 292, 294, and 376, latches 282, 284, 286, and 374 may transmit fused address values Fused RA<1>, Fused RA<2>, Fused RA<3>, and Fused RA<4> from outputs 298, 300, 302, 378 of the latches 282, 284, 286, and 374 respectively. In some embodiments, the control signals received at inputs 288, 290, 292, 294, and 376 may be synchronized or may be the same control signal so as to synchronize operation of the latches 280, 282, 284, 286, and 374.

The repair address match circuitry 368 may further include XOR gates 304, 306, 308, 310, and 380 that each include respective inputs 312, 314, 316, 318, 320, 322, 324, 326, 382, and 384. Input 312 of XOR gate 304 may be coupled to output 296 to receive fused address value Fused RA<0>. Input 314 of XOR gate 304 may be coupled to input 272 to receive row address value RA<0>. Input 316 of XOR gate 306 may be coupled to output 298 to receive fused address value Fused RA<1>. Input 318 of XOR gate 306 may be coupled to input 274 to receive row address value RA<1>. Input 320 of XOR gate 308 may be coupled to output 300 to receive fused address value Fused RA<2>. Input 322 of XOR gate 308 may be coupled to input 276 to receive row address value RA<2>. Input 324 of XOR gate 310 may be coupled to output 302 to receive fused address value Fused RA<3>. Input 326 of XOR gate 310 may be coupled to input 278 to receive row address value RA<3>. Input 382 of XOR gate 380 may be coupled to output 378 to receive fused address value Fused RA<4> and input 384 of XOR gate 380 may be coupled to input 372 to receive row address value RA<4>. Each of the XOR gates 304, 306, 308, 310, and 380 may generate a result (i.e., a binary signal) based on the binary values of the respective fused address and row address value received by the XOR gate 304, 306,

308, 310, and 380. This result (which may be termed an XOR result or a first level result) may be a binary low value ("0") when the binary value of the bits for both of the respective fused address and row address value received by the XOR gate 304, 306, 308, 310, and 380 have a binary low value ("0") or when the binary value of the bits for both of the respective fused address and row address value received by the XOR gate 304, 306, 308, 310, and 380 have a binary high value ("1"). In all other instances, (i.e., when one of the fused address and the address has a first binary value, i.e., a binary high value "1" and the other of the fused address and the address has a second opposite binary value, i.e., a binary low value "0") the result of the XOR gate 304, 306, 308, 310, and 380 will be a binary high value ("1"). The result generated by the XOR gate 304 will be transmitted from output 328 of the XOR gate 304. Likewise, the results generated by the XOR gates 306, 308, 310, and 380 will be transmitted from output 330 of XOR gate 306, output 332 of XOR gate 308, output 334 of XOR gate 310, and output 386 of XOR gate 380.

Additionally, the repair address match circuitry 368 may include a selection circuit 388 (e.g., a selection element). The selection circuit 388 may, for example, be a multiplexer that receives at input 390 output 334 of XOR gate 310 and receives at input 392 that output 386 of XOR gate 380 the operates to select one of the binary values of output 334 of XOR gate 310 and output 386 of XOR gate 380 to generate as a result transmitted from output 394 of the selection circuit 388. The selection circuit 388 may transmit the result based on a control signal received at control input 396. Control input 396 may receive a signal (e.g., a selection bit) that corresponds to whether a respective repair was used in testing and repair.

For example, the signal received by control input 396 may represent when a row (e.g., a PPR row 106 or, for example, a redundant row 104) was used in testing and repair, causing fuse (e.g., the address match selection fuse 165) to be blown. This address match selection fuse 165 being blown is represented via the transmission of a binary high "1" value as a signal to the control input 396 which, in turn, causes the selection circuit 388 to transmit the output 334 of XOR gate 310 (i.e., the comparison result related to row address RA<3>) as the result from output 394. Similarly, the signal received by control input 396 may represent when a row (e.g., a PPR row 106 or, for example, a redundant row 104) was not used in testing and repair, causing the address match selection fuse 165 not to be blown. This address match selection fuse 165 not being blown is represented via the transmission of a binary low "0" value as a signal to the control input 396 (which indicates that since the row was not used in testing and repair, it is available for hPPR). In turn, receipt of the binary low "0" value at the control input 396 causes the selection circuit 388 to transmit the output 386 of XOR gate 380 (i.e., the comparison result related to row address RA<4>) as the result from output 394 to match the sPPR.

The remaining elements of the repair address match circuitry 368 are identical to the elements of the repair address match circuitry 255 and function the same as described above in FIG. 7 with the only exception being that NOR gate 338 receives at input 346 the result from the output 394 of the selection circuit 388. This result from the output 394 of the selection circuit 388 corresponds to a selected one of the comparison result related to row address RA<3> or the comparison result related to row address RA<4> (instead of always being the comparison result related to row address RA<3> from output 334, as discussed above with respect to the repair address match circuitry 255 of FIG. 7). Through the use of the additional address match selection fuse 165, a signal indicative of the state of the address match selection fuse 165 being generated as a control signal, and a selection circuit 388 for the selection of the comparison result related to row address RA<3> or the comparison result related to row address RA<4>, the repair address match circuitry 368 may take into account matching of hPPR and sPPR repair when generating the match signal 256 without inclusion of a separate sPPR match circuit. Accordingly, the repair address match circuitry 368 allows for use of all redundant elements (e.g., PPR rows 106 or redundant rows 104 and PPR rows 106), while still allowing for repair transitions between sPPR and hPPR to matching, thus allowing a user to test with sPPR when blowing in a hPPR repair.

Figure 9:
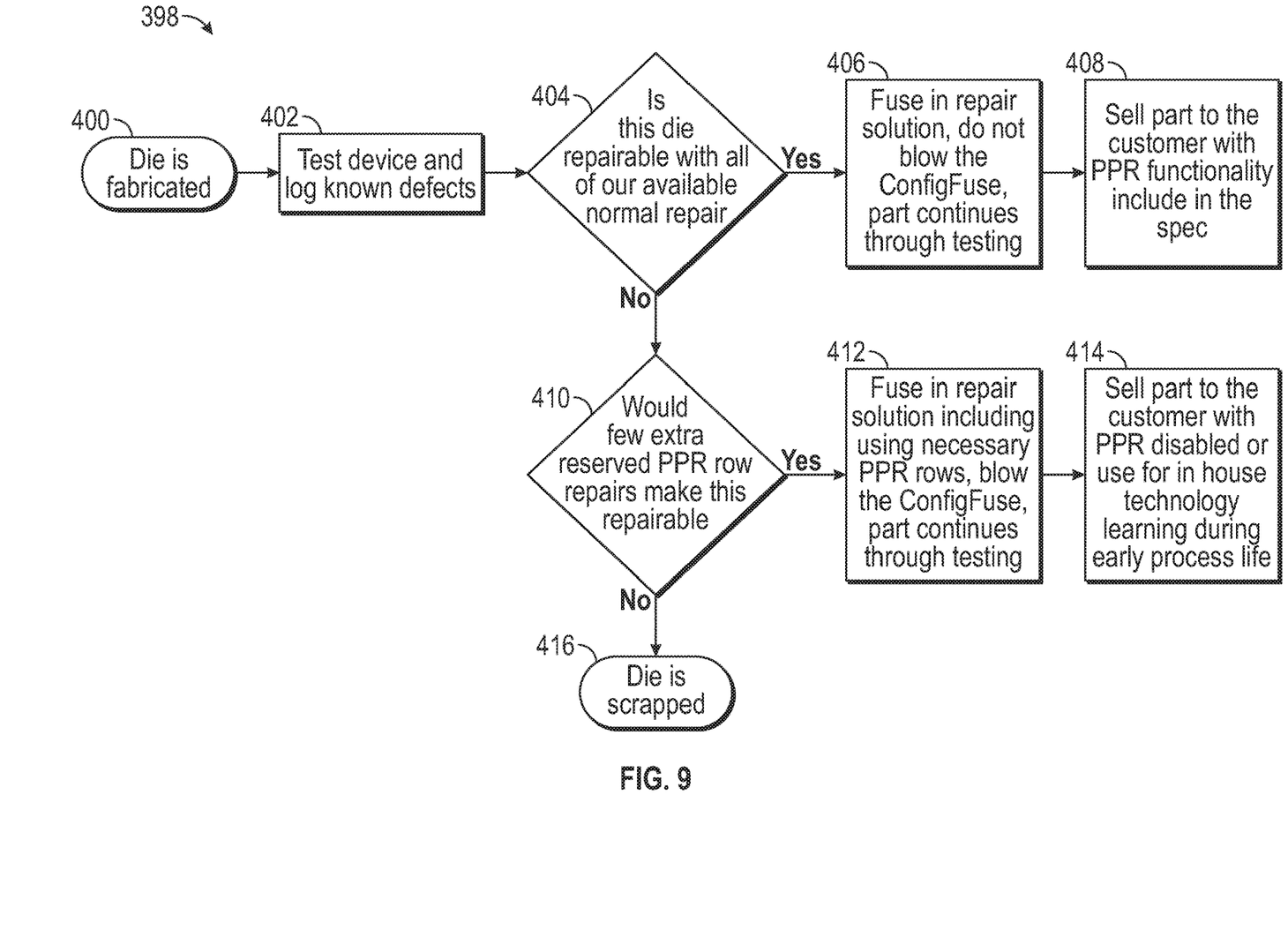
FIG. 9 is a method to perform memory device repair, in accordance with an embodiment.

FIG. 9 illustrates a method 398 for testing a memory device 10 that includes the selection circuit 388. In step 400, the die (i.e., the memory device 10) is fabricated. The fabricated memory device 10 is then tested in step 402 (e.g., either via an external test device coupled to the memory device 10 or via internal testing circuitry of the memory device 10) and defects in the memory device, for example in the memory banks 12, are logged. In step 404, based on the defects determined in step 402, a decision is made (e.g., either via an external test device coupled to the memory device 10 or via internal testing circuitry of the memory device 10) as to whether the memory device 10 can be repaired using a first repair technique (e.g., a "supplier" or "in-house" repair performed by a manufacturer and/or a supplier as a "normal repair"). If, in step 404, it is determined that the memory device 10 can be repaired using a first repair technique, the process moves to step 406 to undertake the first repair technique. This repair technique may be, for example, pre-package repair in which when a defective row of row 102 is identified, the defective row of row 102 may be deactivated and a redundant row 104 may be used in its place (i.e., redundant row repair). To that end, a non-volatile memory system may store information such as the assigned address of the defective row of row 102, and the address of the redundant row 104 to be used in its place. The repairs in step 406 do not include blowing of the address match selection fuse 165. Once testing and/or repair is completed, in step 408, the memory device 10 is transferred to a user/customer as having full PPR functionality.

If, in step 404, it is determined that the memory device 10 cannot be repaired using the first repair technique (and if the memory device did not include the repair address match circuitry 368 and the techniques described with respect to FIG. 8), the memory device 10 would be scrapped. However, when the repair address match circuitry 368 in memory device 10 is present and utilized as describes above, a second determination may be made in step 410. Namely, in step 410, a decision is made (e.g., either via an external test device coupled to the memory device 10 or via internal testing circuitry of the memory device 10) as to whether the memory device 10 can be repaired using a second repair technique (e.g., a "PPR" repair). The second repair technique may, for example, utilize extra reserved PPR rows 106 to make the memory device 10 functional. If, in step 410, it is determined that the memory device 10 can be repaired using the second repair technique, the process moves to step 412 to undertake the second repair technique. This second repair technique may include, for example, a fuse in solution in which additional PPR rows 106 are utilized when a defective row of data rows 102 is identified, such that the defective row of data rows 102 may be deactivated and a row of PPR rows 106 may be used in its place (i.e., PPR row repair). Additionally, a non-volatile memory system may store information such as the assigned address of the defective row of data rows 102, and the address of the row of PPR rows 106 to be used in its place. Furthermore, the repairs in step 412 include blowing of an address match selection fuse 165 that corresponds to each bank 12 affected.

Once testing and/or repair is completed, in step 414, the memory device 10 is transferred to a user/customer as having reduced (e.g., partial) PPR functionality or without PPR functionality. Additionally, depending on PPR rows 106 used in step 412 and/or on the overall amount of PPR rows 106 present in the memory bank 12, the memory device 10 may be checked in step 412 (e.g., either via an external test device coupled to the memory device 10 or via internal testing circuitry of the memory device 10) to determine whether there is sufficient PPR capability (e.g., sufficient PPR rows 106 available) to meet the PPR specifications of the memory device 10. In this case, the memory device 10 may be transferred to a user/customer as having full PPR functionality in step 414.

Alternatively, in step 414, the memory device 10 may instead be used for technology learning (e.g., testing by the manufacturer so as to potentially reduce the instances of data row 102 failures on future memory devices 10.) Likewise, for example, if the memory device 10 is an early stage of its process life (e.g., where no parts require customer PPR functionality), the address match selection fuse(s) 165 could be chosen to consistently be blown in step 412 and so that all of the memory bank(s) 12 of the memory devices 10 might be used for technology learning in step 414. Finally, if, in step 410, it is determined that the memory device 10 cannot be repaired using the second repair technique, the memory device 10 is scrapped in step 416.

Alteration of memory devices 10 to allow for matching of sPPR with hPPR row addresses without compromising manufacturing yield may be attained through the use of the repair address match circuitry 368 and the techniques described with respect to FIG. 8. This eliminates situations in which the PPR element (PPR rows 106) is forced to always use sPPR optimized row address match circuits (which disallows other repairs, thus reducing yield especially early in the production ramp) and situations in which the PPR element (PPR rows 106) utilizes repair address match circuitry 255, which can cause differences in addresses repaired between sPPR and hPPR (whereby potential defects could be introduced to the part in hPPR in which a user cannot view when testing the repair with sPPR). An existing extra address match selection fuse 165 for each memory bank 12 (e.g., as part of an already existing redundant row fuse set) can be utilized to select the match circuit configuration the repair fuse set uses. It should also be appreciated that a unique selection fuse may be additionally and/or alternatively provided per row fuse set or globally per DRAM die, for example, and not just for each memory bank 12.

If a PPR row 106 is needed/used for repair in Probe or Burn, the repair may be completed in-house (e.g., by the manufacturer or supplier) in place of scrapping of the memory bank 12 or the memory device 10 as unrepairable. When used, the additional PPR address match selection fuse 165 is blown to indicate that the repair may use the normal row address match configuration and the repair is then used like every other row repair (e.g., Redundant Rows 104). If this PPR element (e.g., PPR row 106) is not used in the manufacturing test flow (e.g., steps 404, 406, and 408), the address match selection fuse 165 will not be blown. This indicates to the memory device 10 that if it is enabled later for PPR, it should use the row address match configuration that is optimized for sPPR seed row addresses. Thus, potential user concern of sPPR not matching hPPR is reduced and/or eliminated while yields related to using PPR elements for typical manufacturing repair are increased.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A memory device, comprising:
   a memory bank comprising a plurality of addressable groups of memory cells, wherein the plurality of addressable groups of memory cells comprises a primary set of addressable groups and a secondary set of addressable groups; and
   control circuitry configured to activate an addressable group of the memory bank, the control circuitry comprising repair address match circuitry, comprising:
      first inputs configured to receive row address values corresponding to a first group of the primary set of addressable groups;
      second inputs configured to receive fused address values corresponding to a second group of the primary set of addressable groups having been repaired; and
      a selection element, comprising:
         a first selection input configured to receive a first signal indicative of whether a first row address value of the row address values is identical to a first fused address value of the fused address values;
         a second selection input configured to receive a second signal indicative of whether a second row address value of the row address values is identical to a second fused address value of the fused address values; and
         an output configured to selectively transmit a result as one of the first signal or the second signal.

2. The memory device of claim 1, wherein the selection element comprises a multiplexer.

3. The memory device of claim 2, wherein the selection element comprises a control input.

4. The memory device of claim 3, wherein the control input is configured to receive a third signal indicative of whether a fuse is blown.

5. The memory device of claim 3, wherein the control input is configured to receive a third signal indicative of whether a repair utilizing a portion of the secondary set of addressable groups was completed.

6. The memory device of claim 5, wherein the selection element is configured to selectively transmit the result as one of the first signal or the second signal based upon a value of the third signal.

7. The memory device of claim 5, wherein the selection element is configured to selectively transmit the result as the first signal when a value of the third signal is a binary high value indicative that the repair utilizing the portion of the secondary set of addressable groups was completed.

8. The memory device of claim 5, wherein the selection element is configured to selectively transmit the result as the second signal when a value of the third signal is a binary low value indicative that the repair utilizing the portion of the secondary set of addressable groups was not completed.

9. The memory device of claim 1, wherein the repair address match circuitry is configured to generate a match signal based at least in part on the result.

10. The memory device of claim 9, wherein the control circuitry is configured to determine whether to repair the first group of the primary set of addressable groups based at least in part on the match signal.

11. A memory bank controller comprising:
a memory bank comprising a plurality of data rows and a plurality of post-package repair (PPR) rows;
a fuse circuit comprising a plurality of fuses configured to store indications of addresses of PPR rows utilized in place of data rows of the plurality of data rows and comprising an address match selection fuse; and
address match circuitry coupled to the fuse circuit, wherein the address match circuitry comprises:
first inputs configured to receive row address values corresponding to a first data row of the plurality of data rows;
second inputs configured to receive fused address values corresponding to a first PPR row of the plurality of PPR rows; and
a selection element, comprising:
a first selection input configured to receive a first signal indicative of whether a first row address value of the row address values is identical to a first fused address value of the fused address values;
a second selection input configured to receive a second signal indicative of whether a second row address value of the row address values is identical to a second fused address value of the fused address values; and
an output configured to selectively transmit a result as one of the first signal or the second signal.

12. The memory bank controller of claim 11, wherein the address match selection fuse is configured to be blown when a second PPR row of the plurality of PPR rows is utilized to repair a second data row of the plurality of data rows.

13. The memory bank controller of claim 12, wherein the selection element comprises a control input configured to receive a third signal indicative of whether the address match selection fuse is blown.

14. The memory bank controller of claim 13, wherein the selection element is configured to selectively transmit the result as one of the first signal or the second signal based upon a binary value of the third signal.

15. The memory bank controller of claim 11, wherein the address match circuitry is configured to generate a match signal based as part of a hard PPR of the first data row.

16. The memory bank controller of claim 11, wherein the fuse circuit comprises a second address match selection fuse that corresponds to a second memory bank.

17. A method, comprising:
receiving row address values corresponding to a first group of a primary set of addressable groups of a memory bank;
receiving fused address values corresponding to a second group of the primary set of addressable groups of a memory bank having been repaired;
receiving a first signal indicative of whether a first row address value of the row address values is identical to a first fused address value of the fused address values;
receiving a second signal indicative of whether a second row address value of the row address values is identical to a second fused address value of the fused address values; and
selectively transmitting a result as one of the first signal or the second signal.

18. The method of claim 17, comprising receiving a third signal indicative of whether an in-house repair utilizing a portion of a secondary set of addressable groups was completed.

19. The method of claim 18, comprising selectively transmitting the result as one of the first signal or the second signal based upon a value of the third signal.

20. The method of claim 17, comprising generate a match signal based at least in part on the result and determining whether to repair the first group of the primary set of addressable groups based at least in part on the match signal.

* * * * *